(12) United States Patent
Kitabatake et al.

(10) Patent No.: US 8,742,427 B2
(45) Date of Patent: Jun. 3, 2014

(54) SEMICONDUCTOR ELEMENT

(75) Inventors: Makoto Kitabatake, Nara (JP); Masao Uchida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/504,360

(22) PCT Filed: Oct. 14, 2011

(86) PCT No.: PCT/JP2011/005769
§ 371 (c)(1),
(2), (4) Date: Apr. 26, 2012

(87) PCT Pub. No.: WO2012/056642
PCT Pub. Date: May 3, 2012

(65) Prior Publication Data
US 2012/0305944 A1 Dec. 6, 2012

(30) Foreign Application Priority Data
Oct. 29, 2010 (JP) .................................. 2010-243221

(51) Int. Cl.
*H01L 29/15* (2006.01)
(52) U.S. Cl.
USPC ............................................ 257/77; 257/341
(58) Field of Classification Search
USPC .................................................. 257/77, 341
See application file for complete search history.

(56) References Cited

U.S. PATENT DOCUMENTS

| 5,506,421 A | * | 4/1996 | Palmour | 257/77 |
| 5,510,641 A | * | 4/1996 | Yee et al. | 257/367 |
| 5,696,396 A | * | 12/1997 | Tokura et al. | 257/341 |

(Continued)

FOREIGN PATENT DOCUMENTS

| JP | 2009-065185 A | 3/2009 |
| JP | 2010-027833 A | 2/2010 |

(Continued)

OTHER PUBLICATIONS

International Search Report for corresponding International Application No. PCT/JP2011/005769 mailed Jan. 10, 2012.

(Continued)

*Primary Examiner* — Kevin Parendo
*Assistant Examiner* — Charles N Ausar-El
(74) *Attorney, Agent, or Firm* — Renner, Otto, Boisselle & Sklar, LLP

(57) ABSTRACT

A semiconductor element according to the present invention can perform both a transistor operation and a diode operation via its channel layer. If the potential Vgs of its gate electrode 165 with respect to that of its source electrode 150 is 0 volts, then a depletion layer with a thickness Dc, which has been depleted entirely in the thickness direction, is formed in at least a part of the channel layer 150 due to the presence of a pn junction between a portion of its body region 130 and the channel layer 150, and another depletion layer that has a thickness Db as measured from the junction surface of the pn junction is formed in that portion of the body region 130. If the dielectric constant of the wide bandgap semiconductor is identified by $\in$s, the dielectric constant and the thickness of the insulating film 160 are identified by $\in$i and Di, respectively, the sum of Dc and Db is identified by Ds, and the absolute value of the turn-on voltage of the diode is identified by Vf0, then $Ds < Di \cdot \in s/(\in i(2/Vf0-1))$ is satisfied.

5 Claims, 6 Drawing Sheets

(56) References Cited

U.S. PATENT DOCUMENTS

| | | | |
|---|---|---|---|
| 5,744,994 A * | 4/1998 | Williams | 327/374 |
| 5,808,327 A * | 9/1998 | Maier et al. | 257/161 |
| 5,818,084 A * | 10/1998 | Williams et al. | 257/329 |
| 5,929,690 A * | 7/1999 | Williams | 327/374 |
| 6,476,442 B1 * | 11/2002 | Williams et al. | 257/328 |
| 6,531,738 B1 * | 3/2003 | Uemoto et al. | 257/347 |
| 6,956,238 B2 * | 10/2005 | Ryu et al. | 257/77 |
| 7,598,567 B2 * | 10/2009 | Hefner et al. | 257/328 |
| RE41,368 E * | 6/2010 | Uemoto et al. | 257/347 |
| 7,759,760 B2 * | 7/2010 | Yafune et al. | 257/471 |
| 7,829,898 B2 * | 11/2010 | Ootsuka et al. | 257/77 |
| 8,034,688 B2 * | 10/2011 | Hefner et al. | 438/282 |
| 8,283,973 B2 * | 10/2012 | Hashimoto et al. | 327/537 |
| 8,610,130 B2 * | 12/2013 | Ryu et al. | 257/77 |
| 2004/0051104 A1 * | 3/2004 | Yamashita et al. | 257/77 |
| 2004/0104429 A1 * | 6/2004 | Takahashi et al. | 257/338 |
| 2004/0183080 A1 * | 9/2004 | Kusumoto et al. | 257/77 |
| 2005/0001217 A1 * | 1/2005 | Kusumoto et al. | 257/77 |
| 2006/0071246 A1 * | 4/2006 | Kitabatake et al. | 257/270 |
| 2008/0050876 A1 * | 2/2008 | Matocha et al. | 438/269 |
| 2008/0121993 A1 * | 5/2008 | Hefner et al. | 257/341 |
| 2009/0104762 A1 * | 4/2009 | Kusumoto et al. | 438/530 |
| 2010/0090271 A1 * | 4/2010 | Hefner et al. | 257/328 |
| 2010/0148244 A1 * | 6/2010 | Kitabatake et al. | 257/328 |
| 2010/0148718 A1 * | 6/2010 | Kitabatake et al. | 318/798 |
| 2010/0171155 A1 * | 7/2010 | Saha | 257/256 |
| 2011/0272761 A1 * | 11/2011 | Haeberlen et al. | 257/334 |
| 2012/0057386 A1 * | 3/2012 | Adachi et al. | 363/131 |
| 2012/0068263 A1 * | 3/2012 | Hefner et al. | 257/335 |

FOREIGN PATENT DOCUMENTS

| | | | |
|---|---|---|---|
| JP | 2010-509771 T | 3/2010 | |
| WO | 2008/149922 A1 | 12/2008 | |
| WO | 2010/125819 A1 | 11/2010 | |
| WO | 2011/021361 A1 | 2/2011 | |
| WO | WO-2011/021361 A1 * | 2/2011 | H01L 21/336 |
| WO | 2011/089861 A1 | 7/2011 | |

OTHER PUBLICATIONS

Co-pending U.S. Appl. No. 13/266,271, filed Oct. 25, 2011.
European search report along with European search opinion dated Jul. 29, 2013.

* cited by examiner (a)

(b)

(c)

(a)

(b)

(c)

SEMICONDUCTOR ELEMENT

TECHNICAL FIELD

The present invention relates to a semiconductor element and more particularly relates to a wide-bandgap semiconductor element (as a power semiconductor device), which can be used in applications that require a high breakdown voltage and a large amount of current.

BACKGROUND ART

According to conventional power electronics technologies, a Si semiconductor element is generally used in order to control a high breakdown voltage and a huge amount of current in a voltage transformer, for example. More particularly, as a Si transistor functioning as a switch for a voltage transformer, an insulated gate bipolar transistor (IGBT), which can control a high breakdown voltage and a huge amount of current and which has a low ON-state resistance, is used. A Si-IGBT with a vertical structure is virtually always used to control as high a breakdown voltage as 600 V or more and as large an amount of current as 10 A or more. In such a vertical Si-IGBT element structure, the upper surface of the element including a gate that functions as a switch to turn the ON and OFF states of current has the same structure as a gate-channel portion of a metal-insulator-semiconductor field effect transistor (MISFET) with an insulated gate. Usually, a structure similar to a DIMISFET (double implanted MISFET) is fabricated in such a vertical Si-IGBT structure.

FIG. 7(a) is a cross-sectional view illustrating the structure of a Si semiconductor element (which may be a Si-IGBT or a MISFET) 1100. The semiconductor element 1100 is made of a silicon (Si) semiconductor. If the semiconductor element is implemented as an IGBT, the element has a structure in which an n⁻-drift layer 120 is stacked on a p-type Si substrate 110. On the other hand, if the semiconductor element is implemented as a MISFET, the n⁻-drift layer 120 is stacked on an n⁺-Si substrate. As can be seen from the plan view shown in FIG. 7(b), a p-body region 130 has been defined in an upper portion of the n⁻-drift layer 120. And on a plan view as viewed from right over the principal surface of the substrate, a p-body contact region 132 and an n⁺-source region 140 are defined in an upper portion of an internal part of the p-body region 130.

A source electrode 145 has been formed on the p-body contact region 132 and the n⁺-source region 140. On the surface of the p-body region 130, there is a channel region 151, on which a gate insulating film 160 and a gate electrode 165 have been stacked in this order. On a plan view as viewed from right over the principal surface of the substrate, there is an n-type region, which does not include the p-body region 130, on the surface of the drift layer 120. A portion of the drift layer 120 that is interposed between two p-body regions 130 will be referred to herein as a "JFET region" 121. Furthermore, on the back surface of the Si substrate 110, a drain electrode 170 has been formed. In the case of an IGBT, the source electrode 145 and the drain electrode 170 function as an emitter electrode and a collector electrode, respectively.

In this case, a "switching operation" refers to the ability to switch the ON and OFF states of current with the voltage applied between the source electrode 145 and the gate electrode 165 when a DC voltage is applied so that the drain electrode 170 has a positive potential and the source electrode 145 has a negative potential. When a voltage that is equal to or higher than a threshold voltage is applied between the source electrode 145 and the gate electrode 165 so that the gate electrode 165 has a positive potential, the channel region 151 gets depleted and becomes an inversion region. In that case, electrons are ready to move from the source region 140 toward the JFET region 121 via the channel region 151. That is to say, current flows. On the other hand, when no voltage is applied between the source electrode 145 and the gate electrode 165 (i.e., when a gate potential of 0 V is applied), electrons are not ready to move through the surface of the p-body region 130. That is why in that state, no current flows between the source region 140 and the JFET region 121 and the transistor remains OFF. Such a state in which the transistor remains OFF when the gate potential is 0V is called a "normally OFF state". This is a characteristic that a high-breakdown-voltage power device, which should operate safely with current never allowed to flow unintentionally, must have.

This structure is sometimes modified in order to make a huge amount of current flow by adding a channel layer 150 as shown in FIG. 7(c). By introducing the n⁻-channel layer 150 into the interface between the p-body region 130 and the gate insulating film 160, the increase in resistance due to the movement of electrons (i.e., the ON-state resistance) can be minimized. However, a tradeoff is inevitable between the effect of reducing the ON-state resistance with the introduction of the n⁻-channel layer 150 and the normally OFF operation described above. That is why the channel layer should be designed carefully.

As described above, the switching operation is performed when a positive DC voltage is applied to the drain electrode 170 and a negative DC voltage is applied to the source electrode 145. If DC voltages of opposite polarities are applied (i.e., negative and positive voltages are applied to the drain electrode 170 and the source electrode 145, respectively), then the MISFET performs a diode operation. This is because a body diode 180 is formed by the pn junction between the p-body region 130 and the n⁻-drift layer 120 of the MISFET 1100. That is to say, the source electrode 145 makes ohmic contact with the p-body region 130 via the p-body contact region 132. That is why when DC voltages of opposite polarities are applied (i.e., negative and positive voltages are applied to the drain electrode 170 and the source electrode 145, respectively), the forward current produced by the pn junction of the body diode 180 flows between the source electrode 145 and the drain electrode 170. That is to say, if positive and negative voltages are respectively applied to the drain electrode 170 and the source electrode 145, the vertical MISFET 1100 operates as a switch to be controlled with the potential of the gate electrode 165. On the other hand, if negative and positive voltages are respectively applied to the drain electrode 170 and the source electrode 145, then the vertical MISFET 1100 functions as a diode. And when a forward current of a diode flows, a voltage that is equal to or higher than the built-in voltage (of approximately 1 V) of the Si semiconductor is generated.

In a power converter called "inverter", which outputs AC current based on a DC voltage, if the current is output with respect to an L load with an inductance component (i.e., an inductive load) such as the winding of a motor, the voltage applied may be opposite to what is applied during the switching operation and the forward current of the body diode may sometimes flow.

Also, as for the Si semiconductor, a pseudo-Schottky diode, which performs a diode operation using the vertical MISFET structure shown in FIG. 7(c), has been invented (see Patent Document No. 1). The operation of that element may be the same as the diode operation in a situation where negative and positive voltages are respectively applied to the drain electrode 170 and the source electrode 145. However, the element is designed so that current flows mostly through the channel layer 150, not the body diode 180. That element can be designed so that the current that flows through the channel layer 150 in the reverse direction to the current that flows during the transistor operation can start to flow even if the voltage is equal to or smaller than the built-in voltage (of about 1 V) of the Si semiconductor when negative and positive voltages are respectively applied to the drain electrode 170 and the source electrode 145 and that current never passes through the body diode.

In the vertical MISFET and pseudo-Schottky diode described above, the design of the channel layer is linked to the design of the MOS interface and needs to be carried out based on a complicated principle and know-how that has been obtained from a huge amount of actually measured data. In the prior art, a channel layer with a thickness of 0.1 µm or more, n-type conductivity, and a concentration of $2 \times 10^{17}$ cm$^{-3}$ or less has been used.

As related technologies, an MOS diode that uses Si is disclosed in Patent Document No. 2 and an MOS transistor that uses SiC is disclosed in Patent Document No. 3.

CITATION LIST

Patent Literature

Patent Document No. 1: U.S. Pat. No. 5,818,084
Patent Document No. 2: Japanese Laid-Open Patent Publication No. 2009-065185
Patent Document No. 3: PCT International Application Japanese National Phase Patent Publication No. 2010-509771

SUMMARY OF INVENTION

Technical Problem

If a power converter such as an inverter is formed using, as a switching element, a Si semiconductor element (power device) that may be a MISFET or an IGBT for use in applications that require a high breakdown voltage and a large amount of current and if that converter provides output for an L load such as the winding of a motor, a diode needs to be added in parallel with the switching element. This is because the switching circuit needs to make current flow even when the applied voltage has an opposite polarity to what is applied during its switching operation. In this case, as a Schottky diode ordinarily has a low breakdown voltage, a pn junction diode should be used as the diode with a breakdown voltage of 600 V or more. While current is flowing through a pn diode, minority carriers are injected from the pn junction into the n$^-$-drift layer of the diode. If a reverse bias voltage were applied right after the diode has gotten its operation done, the recovery time would increase due to the presence of those minority carriers with a long life, and a large amount of recovery current would be generated, which would in turn cause a significant increase in loss. That should be a problem. The life of those minority carriers can be certainly shortened by introducing crystal defects through irradiation of a corpuscular radiation and promoting the recombination. However, the problem has not been overcome yet to the point that the recovery time can be short enough to avoid causing a significant loss.

Also, as long as the amount of current is small, the pseudo-Schottky diode may be used instead of the conventional pn junction diode. Then, no minority carriers will be injected and the recovery problem described above can be overcome. However, if the amount of current is as large as 10 A or more, for example, current will flow through a parasitic body diode even in the pseudo-Schottky diode. In that case, minority carriers are injected from the pn junction of the body diode into the n$^-$-drift layer. The recovery time will increase due to the presence of those minority carriers with a long life, and a large amount of recovery current will be generated, which will in turn cause a significant increase in loss. That is a problem. On top of that, the pseudo-Schottky diode is also too expensive to be used extensively on an industrial basis.

If diode current is made to flow through the body diode of the MISFET that has already been described in the background section, then the number of elements that form a circuit can be reduced and the cost can also be cut down effectively. In that case, however, the following problems will arise. Particularly if current is made to flow by turning the body diode ON in order to do switching in an application that requires a high breakdown voltage and a large amount of current, an awesome lot of minority carriers will be injected from the pn junction of the MISFET into the n$^-$-drift layer 120. Then, the recovery time will increase due to the presence of those minority carriers with a long life, and a large amount of recovery current will be generated, which will in turn cause a significant increase in loss. That is a problem. On top of that, since the MISFET process is too complicated, it is difficult to control the life of minority carriers for the body diode by introducing crystal defects as in the conventional pn junction diode. Consequently, in that case, the recovery time is usually rather long and the recovery loss is ordinarily significant, which is also a problem.

Furthermore, the MISFET and the pseudo-Schottky diode could be integrated together. However, it is impossible for a single structure to operate as an MISFET and as a pseudo-Schottky diode and nobody has ever reported such a structure. Even if this idea is adopted, a micro element operating as a MISFET and a micro element operating as a pseudo-Schottky diode can be simply arranged in parallel with each other. That is why it is difficult to reduce the size of such a structure, which is also a problem. Actually, the overall area of such a structure, which is the sum of the area of the MISFET functioning as a switching element and that of the pseudo-Schottky diode functioning as a diode, cannot be reduced so much.

A MISFET and a pseudo-Schottky diode implemented as silicon carbide semiconductor elements have already been reported (see Patent Document No. 3, for example). However, as stated in that document, when the structure of the element is designed, a tradeoff is inevitable between the MISFET operation and the pseudo-Schottky diode operation. That is to say, as already described with respect to the Si semiconductor, Patent Document No. 3 also states that it is impossible for a single structure to carry out the MISFET operation and the pseudo-Schottky diode operation while maintaining performance that is high enough to apply it on an industrial basis.

As for the pseudo-Schottky diode that performs a diode operation using the vertical MISFET structure described above, a Si element and a SiC element have already been disclosed in Patent Documents Nos. 2 and No. 3, respectively. As disclosed in Paragraph [0097] of Patent Document No. 3, for example, these diodes can be certainly designed to have a forward current electrical characteristic (i.e., a source-drain voltage Vf0 at which current starts to flow in the positive direction during the diode operation). That is to say, the diode current can be made to flow at a source-drain voltage Vf0 that is smaller than the built-in potential of a pn diode. Patent Document No. 3 also discloses in Paragraph [0100] that the pseudo-Schottky diode that performs a diode operation using such a vertical MISFET structure can also function as a MISFET as originally intended by designing a combined threshold voltage regulating/SIR channel layer and by applying a voltage between the source and gate. According to that Patent Document No. 3, the channel layer should have its concentration controlled within the range of $1\times10^{15}$ to $5\times10^{17}$ cm$^{-3}$ and have its thickness controlled within the range of 0.05 μm to 1 μm (see Paragraphs [0101] of Patent Document No. 3). And Patent Document No. 3 does say that "a tradeoff should be made between the MISFET control function and the reverse conduction SIR function".

That is to say, in the structure disclosed in that preceding example, a film that has a thickness of 0.05 μm or more and that is doped with an n-type dopant with a concentration of $5\times10^{17}$ cm$^{-3}$ or less is used as the channel layer. Thus, that document indicates that the element is formed by extending either the structure of the Si semiconductor MISFET or that of the pseudo-Schottky diode.

It is therefore an object of the present invention to provide, first and foremost, a semiconductor element that has a transistor characteristic and yet can also function as a diode and that does not have to make a tradeoff between the threshold voltage of the transistor and the turn-on voltage of the diode.

Solution to Problem

A semiconductor element according to the present invention includes a metal-insulator-semiconductor field effect transistor, which includes a wide-bandgap semiconductor. The wide bandgap semiconductor includes: a body region of a first conductivity type; a source region of a second conductivity type, which contacts with at least a portion of the body region; a drift region of the second conductivity type, which is isolated from the source region via that portion of the body region; and a channel layer of the second conductivity type, which contacts with the surface of that portion of the body region that is located between the source region and the drift region. The transistor further includes: an insulating film that contacts with the surface of the channel layer; a gate electrode that faces the channel layer with the insulating film interposed between them; a source electrode that contacts with the source region; and a drain electrode that is electrically connected to the drift region. Supposing the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of current flowing from the drain electrode toward the source electrode is defined to be a forward direction, and the direction of current flowing from the source electrode toward the drain electrode is defined to be a reverse direction, if Vgs≥Vth, then the metal-insulator-semiconductor field effect transistor makes the drain electrode and the source electrode electrically conductive with each other via the channel layer. If 0 volts≤Vgs≤Vth, then the metal-insulator-semiconductor field effect transistor functions as a diode that makes no current flow in the forward direction but makes current flow in the reverse direction from the source electrode toward the drain electrode via the channel layer when Vds<0 volts. If the potential Vgs of the gate electrode with respect to the potential of the source electrode is 0 volts, then a depletion layer with a thickness Dc, which has been depleted entirely in the thickness direction, is formed in at least a part of the channel layer due to the presence of a pn junction between that portion of the body region and the channel layer, and another depletion layer that has a thickness Db as measured from the junction surface of the pn junction is formed in that portion of the body region. Supposing the dielectric constant of the wide bandgap semiconductor is identified by ∈s, the dielectric constant and the thickness of the insulating film are identified by ∈i and Di, respectively, the sum of Dc and Db is identified by Ds, and the absolute value of a turn-on voltage of the diode is identified by Vf0, then $Ds<Di\cdot\in s/(\in i(2/Vf0-1))$ is satisfied.

In one embodiment, the wide bandgap semiconductor is made of silicon carbide, and supposing the dopant concentrations of the body region and the channel layer are identified by Nb and Nc, respectively, Vf0<1 volt, Ds<2Di, Nb>$1\times10^{17}$ cm$^{-3}$, and Nc>$1\times10^{17}$ cm$^{-3}$ are satisfied.

In one embodiment, supposing the dopant concentration of the body region is identified by Nb, the dopant concentration of the channel layer is identified by Nc, the built-in potential of the pn junction is identified by Pbi, and elementary charge is q, $(1+(\in s/\in i)\cdot(Di/Ds))>2/(Pbi-(0.5q/\in s)\cdot(Nb\cdot Db(Db+2Dc)-Nc\cdot Dc^2))>2$ is satisfied.

In one embodiment, the wide bandgap semiconductor is made of silicon carbide, and supposing the dopant concentrations of the body region and the channel layer are identified by Nb and Nc, respectively, Vf0<0.5 volts, Ds<(2/3)·Di, Nb>$1\times10^{18}$ cm$^{-3}$, and Nc>$1\times10^{18}$ cm$^{-3}$ are satisfied.

In one embodiment, supposing the dopant concentration of the body region is identified by Nb, the dopant concentration of the channel layer is identified by Nc, the built-in potential of the PN junction is identified by Pbi, and elementary charge is q, $(1+(\in s/\in i)\cdot(Di/Ds))>2/(Pbi-(0.5q/\in s)\cdot(Nb\cdot Db(Db+2Dc)-Nc\cdot Dc^2))>4$ is satisfied.

In one embodiment, Ds is greater than 14 nm.

In one embodiment, at least one of Nb and Nc is equal to or smaller than $1.4\times10^{19}$ cm$^{-3}$.

In one embodiment, the wide bandgap semiconductor is made of silicon carbide, and Ds is smaller than 50 nm.

Advantageous Effects of Invention

The present invention provides a vertical MISFET that operates with good stability with almost no diode current allowed to flow through a body diode, which is defined by a pn junction.

DESCRIPTION OF EMBODIMENTS

Hereinafter, embodiments of a semiconductor element according to the present invention will be described.

First of all, an exemplary configuration for a semiconductor element as an embodiment of the present invention will be described with reference to FIG. 1. The semiconductor element of this embodiment is a silicon carbide semiconductor element (power semiconductor device) and includes a metal-insulator-semiconductor field effect transistor (MISFET) 1000, which is typically a MOSFET.

Figure 1:
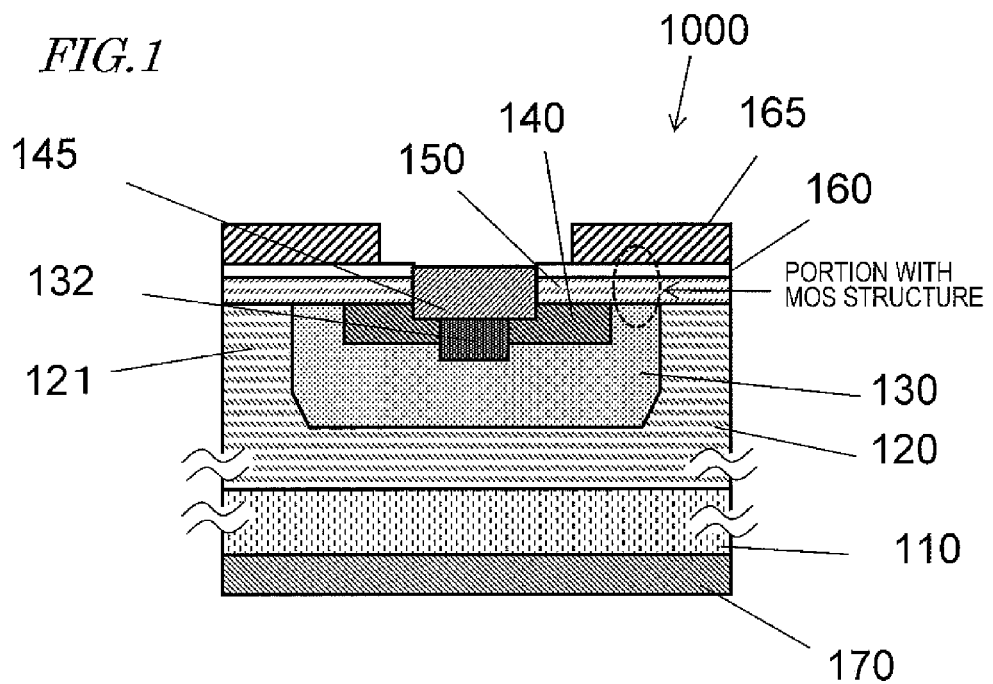
FIG. 1 A cross-sectional view generally illustrating a semiconductor element as an embodiment of the present invention.

As shown in FIG. 1, the silicon carbide semiconductor portion of the MISFET 1000 includes: a body region 130 of a first conductivity type; a source region 140 of a second conductivity type, which contacts with at least a portion of the body region 130; a drift region 120 of the second conductivity type, which is isolated from the source region 140 via that portion of the body region 130; and a channel layer 150 of the second conductivity type, which contacts with the surface of that portion of the body region 130 that is located between the source region 140 and the drift region 120.

The MISFET 1000 further includes an insulating film 160 that contacts with the surface of the channel layer 150, a gate electrode 165 that faces the channel layer 150 with the insulating film 160 interposed between them; and a source electrode 145 that contacts with the source region 140.

In this embodiment, the silicon carbide semiconductor portion including the drift region 120 and other regions and layers is supported by a silicon carbide semiconductor substrate 110 of the second conductivity type, and a drain electrode 170 is arranged on the back surface of the substrate 110. The drain electrode 170 is electrically connected to the drift region 120.

In this description, the potential of the drain electrode 170 with respect to the potential of the source electrode 145 is identified by Vds. The potential of the gate electrode 165 with respect to the potential of the source electrode 145 is identified by Vgs. The gate threshold voltage of the MISFET 1000 is identified by Vth. The direction of current flowing from the drain electrode 170 toward the source electrode 145 is defined to be a "forward direction". And the direction of current flowing from the source electrode 145 toward the drain electrode 170 is defined to be a "reverse direction".

If Vgs≥Vth, then the MISFET 1000 makes the drain electrode 170 and the source electrode 145 electrically conductive with each other via the channel layer 150.

On the other hand, if 0 volts≤Vgs<Vth, then the MISFET 1000 functions as a diode that makes no current flow in the "forward direction" but makes current flow in the "reverse direction" from the source electrode 145 toward the drain electrode 170 via the channel layer 150 when Vds<−Vf0 volts. Naturally, if the diode makes current flow in the "reverse direction", then "forward current" flows through the diode itself.

In this description, a diode that makes current flow from the source electrode 145 toward the drain electrode 170 via the channel layer 150 when the transistor is in OFF state will be referred to herein as a "channel diode". Just like a pseudo-Schottky diode, if the amount of current is small, then no current will flow through the pn junction body diode in the "channel diode" of the present invention, either. However, even if the amount of current is large, no current flows through the pn junction body diode, either, in the channel diode of the present invention, which is a unique feature of the diode of the present invention that is absent from the conventional Si pseudo-Schottky diode.

If the potential Vgs of the gate electrode 165 with respect to the potential of the source electrode 145 is 0 volts, then a depletion layer with a thickness Dc, which has been depleted entirely in the thickness direction, is formed in at least a part of the channel layer 150, on a plan view as viewed perpendicularly to the principal surface of the channel layer 150, due to the presence of a pn junction between that portion of the body region 130 and the channel layer 150. At the same time, another depletion layer that has a thickness Db as measured from a junction surface of the pn junction is formed in that portion of the body region 130.

If the dielectric constant of the "wide bandgap semiconductor", which is the silicon carbide semiconductor in this embodiment, is identified by $\in s$, the dielectric constant and the thickness of the insulating film 160 are identified by $\in i$ and Di, respectively, the sum of Dc and Db is identified by Ds, and the absolute value of a turn-on voltage of the diode is identified by Vf0, then the semiconductor element of this embodiment satisfies Ds<Di·$\in s$/($\in i$ (2/Vf0−1)). In this description, the "turn-on voltage" of the diode is defined to be the magnitude of a potential at which current starts to flow from the source electrode 145 toward the drain electrode 170 while the potential of the drain electrode 170 with respect to that of the source electrode 145 is being decreased from zero volts. When a forward voltage of Vf0 or more is applied to the diode, forward current flows through the diode. According to the definition described above, this forward current is current that flows in the "reverse direction" for the semiconductor element.

Figure 2:
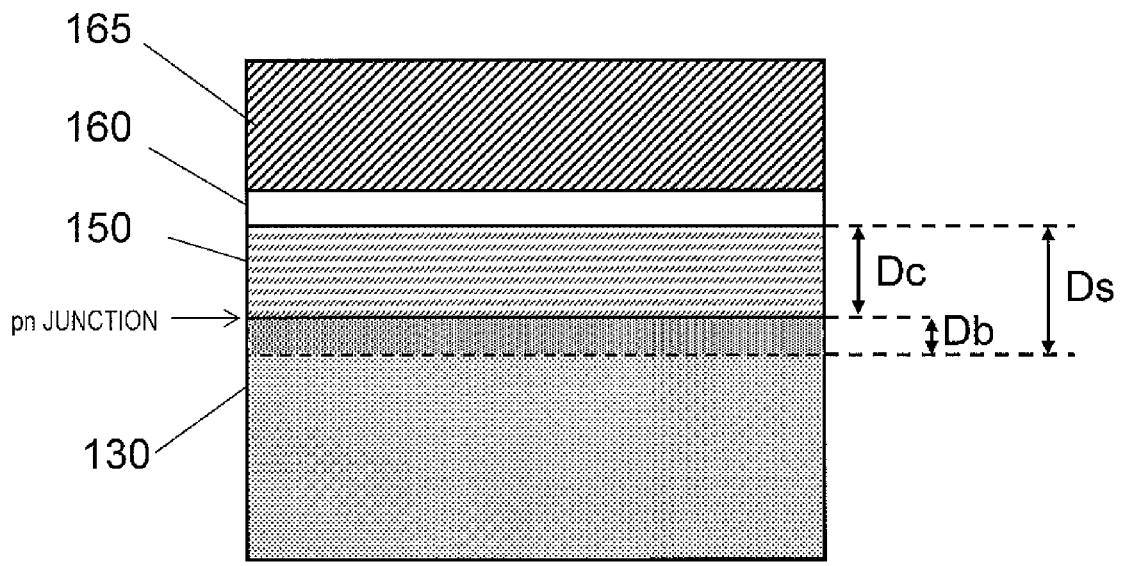
FIG. 2 A schematic cross-sectional view illustrating a part of FIG. 1 on a larger scale.

FIG. 2 schematically illustrates, on a larger scale, the depletion layer to be formed in the region indicated by the dashed ellipse in FIG. 1 (which will be referred to herein as an "MOS structure portion") when Vgs=zero volts. As shown in FIG. 2, a depletion layer with the thickness Dc, which has been depleted entirely in the thickness direction of the channel layer 150, is formed due to the pn junction between the body region 130 and the channel layer 150. At the same time, another depletion layer that has the thickness Db as measured from the junction surface of the pn junction is formed in the body region 130.

As can be seen, the semiconductor element of this embodiment includes the silicon carbide semiconductor substrate 110 of the second conductivity type and the drift region 120 of silicon carbide of the second conductivity type that has been formed on the surface of the substrate 110. The drift region 120 of the second conductivity type is the rest of the silicon carbide layer that has been formed on the substrate 110 other than its portion including the body region 130 of the first conductivity type. Such a portion will be referred to herein as a "second conductivity type portion". In the following description, the silicon carbide layer including the "drift region 120" and the "body region 130" will be sometimes referred to herein as a "drift layer" for convenience sake.

In this embodiment, the silicon carbide semiconductor substrate 110 is an $n^+$-substrate ($n^+$-SiC substrate) and the drift region 120 is an n⁻-region. That is to say, according to this embodiment, the second conductivity type is n type and the first conductivity type is p type. However, these n and p types may naturally be changed with each other. It should be noted that the superscript "+" or "−" added to the conductivity type "n" represents the relative concentration of the dopant introduced. That is to say, "n⁺" means that the concentration of an n-type dopant added is higher than "n", while "n⁻" means that the concentration of an n-type dopant added is lower than "n".

As described above, in the drift layer, defined is a p-body region 130 of the first conductivity type. And in the p-body region 130, defined is a source region 140 of the second conductivity type. The source region 140 is an n⁺ type. In this description, the p-body region 130 will be referred to herein as sometimes a "p-body layer" and sometimes a "p-base region".

A p⁺-type contact region 132 is further defined in the p-body region 130. And a source electrode 145 is arranged on the source region 140. Specifically, the source electrode 145 covers the surface of both the n⁺-source region 140 and the p⁺-contact region 132 and is electrically in contact with both of the n⁺-source region 140 and the p⁺-contact region 132. The p⁺-contact region 132 is also electrically in contact with the p-body region 130. If the p-body region 130 has a sufficiently high dopant concentration, then the p⁺-contact region 132 may be omitted and the source electrode 145 may directly contact with the p-body region 130.

A surface portion of the n⁻-drift region 120, which is interposed between the p-body region 130, functions as a JFET (junction field-effect transistor) region 121. As this region forms part of the drift region 120, a dopant of the second conductivity type (which is n type in this example) may be introduced by ion implantation, for example, in order to lower the resistance in the JFET region 121, and the that part may have a higher dopant concentration than the rest of the drift region 120.

Figure 7:
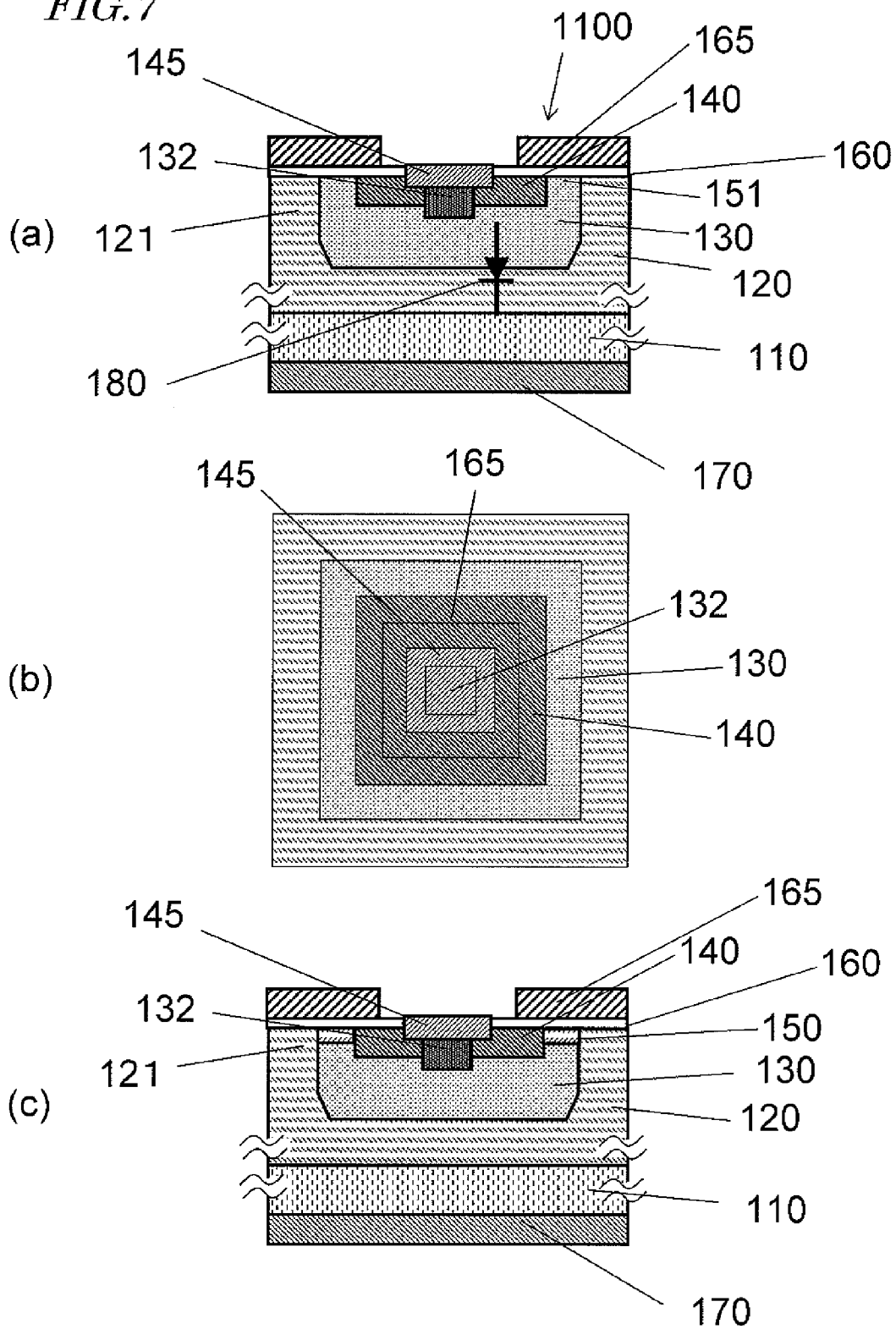
FIG. 7 (a) is a cross-sectional view generally illustrating a conventional semiconductor element, (b) is a general top view thereof, and (c) is a cross-sectional view generally illustrating a semiconductor element in which a channel layer is added to the semiconductor element shown in FIG. 7(a).

On the drift region 120, an n-type channel layer 150 has been formed so as to be at least partially in contact with the p-body region 130 and the n⁺-source region 140. In this embodiment, the channel layer 150 has been grown epitaxially, for example, on the drift layer in which the p-body region 130 and the n⁺-source region 140 have been defined. The channel layer 150 may be a region that has been defined by implanting an n-type dopant into an upper portion of the p-body region 130 as shown in FIG. 7(c). A gate insulating film 160 has been deposited on the channel layer 150. A gate electrode 165 has been formed on the gate insulating film 160. And a drain electrode 170 has been formed on the back surface of the substrate 110.

The present inventors carefully analyzed the operations of the FET and the pseudo-Schottky diode in the structure surrounding the channel of the MISFET, thereby discovering the following principle of operation. And based on that discovery, the present inventors invented a novel semiconductor element that can operate as both a MISFET and a diode alike. Specifically, the present inventors derived a general formula (which is Equation (7) to be described later) representing the minimum voltage Vf0 between the drain electrode and the source electrode at which forward current starts to flow through the diode. Next, the present inventors further derived a general formula (which is Equation (8) to be described later) representing the relation between the voltage Vth applied to the gate electrode that turns the transistor ON and Vf0, which is an important factor that determines the MISFET operation. As a result, the present inventors discovered a structure that can perform both the MISFET operation and the diode operation without making a tradeoff between them.

Hereinafter, the principle of operation of the present invention will be described.

As described above, if the potential Vgs of the gate electrode 165 with respect to the potential of the source electrode 145 is 0 volts, then a depletion layer with a thickness Dc, which has been depleted entirely in the thickness direction, is formed in at least a part of the channel layer 150 due to the presence of a pn junction between the body region 130 and the channel layer 150 (see FIG. 2). In this case, another depletion layer that has a thickness Db as measured from the junction surface of the pn junction is formed in the body region 130. That is why the overall thickness Ds of the depletion layers formed in the semiconductor is represented by the following Equation (1):

$$Ds = Dc + Db \quad (1)$$

The depletion layer surrounding the channel layer 150 of the MISFET needs to satisfy the following Inequality (2):

$$\frac{Ds \cdot Emax}{2} > Pbi \quad (2)$$

where Emax is the maximum electric field at or under which no leakage current flows through the pn junction without producing avalanche current in the semiconductor and Pbi is the built-in potential of the pn junction of the semiconductor.

By modifying this inequality, the following Inequality (2') is obtained:

$$Ds > \frac{2Pbi}{Emax} \quad (2')$$

If the Si semiconductor's physical property values including Pbi=1 V and Emax=0.3×10⁶ V are substituted into this Inequality (2'), then 2·Pbi/Emax=6.7×10⁻⁶ cm=about 70 nm is satisfied. Therefore, the following Inequality (3) is satisfied.

$$Ds > \text{about 70 nm} \quad (3)$$

In this case, if the elementary charge q is 1.6×10⁻¹⁹ coulomb and the dopant concentration of the channel layer is identified by Nc, then the maximum electric field E generated at the pn junction portion is represented by the following Equation (4) according to the Poisson's equation:

$$\frac{q}{\varepsilon s} \cdot Nc \cdot Ds = E \quad (4)$$

If this electric field E should be smaller than Emax, then Nc and Ds need to be set so that the following Inequality (5) is satisfied:

$$Nc < \frac{\varepsilon s}{q} \cdot \frac{Emax}{Ds} \quad (5)$$

If Ds is set to be about 70 nm in the case of a Si semiconductor, the right side of this Inequality (5) becomes approximately 2×10¹⁷ cm⁻³. That is why Nc (Si) needs to be smaller than approximately 2×10¹⁷ cm⁻³.

In the case of a Si semiconductor, if the channel layer had a thickness of less than 70 nm and a dopant concentration of greater than approximately $2\times10^{17}$ cm$^{-3}$, it would be difficult to establish the state where no current flows through the channel layer when the potential Vgs of the gate electrode 165 with respect to that of the source electrode 145 is 0 volts.

These acceptable ranges of the channel layer's thickness and dopant concentration are not contradictory to the fact that a layer with a thickness of 0.1 μm (i.e., 100 nm) or more, n-type conductivity, and a dopant concentration of $2\times10^{17}$ cm$^{-3}$ or less has been used as the Si channel layer (see Patent Document No. 1, for example) as already mentioned in the background section. That is to say, our consideration to the function of the depletion layer around the channel layer turned out to be not contradictory to the conventional know-how based design policy for Si elements.

When the present inventors applied that consideration to SiC, we discovered that by forming the channel layer 150, of which the thickness and dopant concentration were both outside of preferred ranges for the conventional Si semiconductor channel layer, the semiconductor element could operate with good stability.

If SiC semiconductor's physical property values including Pbi=about 3 V and Emax=about $3\times10^6$ V are substituted into Inequalities (2) and (5) described above, the following Inequalities (3') and (5') can be obtained:

$$Ds(SiC) > 2\times10^{-6} \text{ cm} = 20 \text{ nm} \tag{3'}$$

$$Nc(SiC) < 7\times10^{18} \text{ cm}^{-3} \tag{5'}$$

In this case, the dopant concentration Nc of the channel layer is supposed to be uniform in the thickness direction and the dopant concentration Nb of the body region is supposed to be much higher than the dopant concentration Nc of the channel layer. That is why it can be said that the depletion layer would be thin at the body region's end and the thickness Ds of the depletion layer would be approximately equal to the thickness Dc of the channel layer.

According to the consideration described above, it can be seen that even if the thickness of the channel layer is smaller than approximately 70 nm, which has been believed to be the minimum required thickness for a Si-based semiconductor element, a SiC-based semiconductor element with such a thin channel layer can also operate with no problem. It can also be seen that even if the dopant concentration of the channel layer is higher than approximately $2\times10^{17}$ cm$^{-3}$, which they believe may not be exceeded in a Si-based semiconductor element, a SiC-based semiconductor element with a channel layer having such a high dopant concentration can also operate with no problem.

For comparison, suppose the assumption described above is not satisfied and Dc and Db are substantially equal to each other. For example, suppose a situation where the dopant concentrations Nb and Nc of the body region and the channel layer have the same order of magnitude.

Ds=Dc+Db. That is why supposing Dc and Db are substantially equal to each other, even if Nc is twice as high as the value described above, the SiC semiconductor element can also operate with good stability. That is to say, it can be seen from Inequality (5') that even if Nc, Nb<$1.4\times10^{19}$ cm$^{-3}$, stabilized function can also be achieved. In other words, if at least one of Nc and Nb is less than $1.4\times10^{19}$ cm$^{-3}$, then SiC can function as a semiconductor with good stability.

As for Ds described above, the potential in the depletion layer at the pn junction is supposed to have dropped all the way down to the level of the built-in potential at the pn junction of the semiconductor (which corresponds to the bandgap). Since the semiconductor element of the present invention is not a Normally ON type, when no voltage is applied between the source electrode and the gate electrode, the potential that has dropped at the pn junction between the channel layer and the body region according to the present invention is less than the built-in potential at the pn junction of the SiC semiconductor (which corresponds to the bandgap). On the other hand, since Vf0 is sufficiently low, the potential drop is preferably 2 V or more in order to prevent current from flowing through the body diode even when a large amount of current is made to flow through the channel diode. In that case, the lower limit of Ds becomes two-thirds of 20 nm. That is why the following Inequality is satisfied:

$$Ds(SiC) > 14 \text{ nm}$$

The present inventors discovered that in an MOS diode, the potential drop Pd on the surface of the channel layer (i.e., on the surface of an oxide film) is represented by the following Equation (6):

$$Pd = \frac{1}{2} \cdot \frac{q}{\varepsilon s} \cdot (Nb \cdot Db(Db + 2Dc) - Nc \cdot Dc^2) \tag{6}$$

Also, the present inventors discovered via experiments that the relation between Pd and Vf0 is represented by the following equations:

$$Vf0 = Pbi - Pd$$

That is why the following Equation (7) is satisfied:

$$Vfo = Pbi - \frac{1}{2} \cdot \frac{q}{\varepsilon s}(Nb \cdot Db(Db + 2Dc) - Nc \cdot Dc^2) \tag{7}$$

The present inventors also discovered that the gate threshold voltage Vth at which current starts to flow through the MISFET can be represented as a function of Vf0 by the following Equation (8):

$$Vth = Vfo\left(1 + \frac{\varepsilon s}{\varepsilon i} \cdot \frac{Di}{Ds}\right) \tag{8}$$

∈i and Di respectively represent the dielectric constant and thickness of the insulating film 160. Ds used in this case is the thickness of the depletion layer of the semiconductor to which the voltage Vth is applied, and different from Dc+Db of Equation (7), strictly speaking. However, the present inventors confirmed that in a region where the p-body region has a sufficiently high concentration Nb, there is only a slight difference and calculations can be made with almost no problem even if Ds=Dc+Db is supposed to be satisfied.

A condition for operating an MISFET safely is to set Vth to be equal to or greater than a certain positive value. For example, a MISFET or any other switching element for use in a power electronic circuit should have a gate threshold voltage Vth that is normally greater than 2 V. This is because an element, of which the threshold voltage Vth is equal to or smaller than 2 V, would switch current erroneously due to the noise involved with the switching operation, thus making it impossible to guarantee that such an element should operate safely.

On the other hand, the minimum voltage Vf0 between the drain and source electrodes, at which forward current starts to flow through the diode, should be set to be equal to or smaller than a certain value. Particularly, even if a huge amount of current that should flow when the semiconductor element functions as a switching element flowed in the reverse direction when the semiconductor element functions as a diode but if the turn-on voltage Vf0 of the diode is set to be smaller than 1 V, a structure in which almost no current flows through the parasitic body diode is realized. The switching current (i.e., current in the positive direction) of the MISFET is ordinarily limited so that the forward voltage Vf in the positive direction becomes smaller than 2 V in view of the heat that could be generated from the semiconductor element and other problems. The voltage Vf is defined to be the product of the switching current and the ON-state resistance of the MISFET (which relates to a voltage drop). When the semiconductor element operates as an inverter, this current becomes diode current to make the inverter electrically conductive. That is why the forward voltage (i.e., Vf in the reverse direction) of the diode current is obtained by adding Vf0 to Vf in the positive direction (which is less than 2 V). If Vf0 is less than 1 V, this value is limited to less than 3 V. That diode forward voltage of less than 3 V is approximately equal to or smaller than the built-in potential of about 3 V at the pn junction of silicon carbide. Consequently, if Vf0 is less than 1 V, almost no current will flow through the parasitic body diode.

Taking the requirement Vth>2 V for the MISFET operation and the requirement Vf0<1 V for the diode operation into consideration, the following Equation (9) is derived from Equation (8):

$$\frac{Vth}{Vfo} = 1 + \frac{\varepsilon s}{\varepsilon i} \cdot \frac{Di}{Ds} \quad (9)$$

By modifying this Equation (9), the following Equation (9') is obtained:

$$Ds = \frac{\varepsilon s}{\varepsilon i} \cdot \frac{Di}{\left(\frac{Vth}{Vfo} - 1\right)} \quad (9')$$

To set Vth in this Equation (9') to be greater than 2 V, Ds should be set so as to satisfy the following Inequality (9")

$$Ds < \frac{\varepsilon s}{\varepsilon i} \cdot \frac{Di}{\left(\frac{2}{Vfo} - 1\right)} \quad (9'')$$

The Di and Vf0 settings may change depending on in what situation the semiconductor element of the present invention is used. That is why in the semiconductor element of the present invention, it is essential to set Ds based on given Di and Vf0 so as to satisfy this Inequality (9").

If Vf0 is less than 1 V, then Inequality (9") can be modified into the following Inequality (10):

$$Ds < \frac{\varepsilon s}{\varepsilon i} \cdot Di \quad (10)$$

In a silicon carbide MISFET of which the semiconductor is silicon carbide and the insulating film is made of silicon dioxide, $\varepsilon s/\varepsilon i \cdot 2.2$, and therefore, the following Inequality (11) is satisfied:

$$Ds < 2Di \quad (11)$$

As an ordinary silicon carbide semiconductor element is driven with a gate voltage of 20 V, Di is usually set to be 70 nm and it is preferred that Ds satisfy the following Inequality (12):

$$Ds < \text{about } 140 \text{ nm} \quad (12)$$

If Equation (9) is generalized on the condition that Vth>2 V and Vf0<1 V are satisfied, the following Inequality (13) is obtained:

$$1 + \frac{\varepsilon s}{\varepsilon i} \cdot \frac{Di}{Ds} > \frac{2}{Pbi - \frac{q}{2\varepsilon s}(Nb \cdot Db(Db + 2Dc) - Nc \cdot Dc^2)} > 2 \quad (13)$$

As can be seen easily from Equation (9), the leftmost term of Inequality (13) is equal to Vth/Vf0 and Vf0 is equal to the denominator of the middle term of Inequality (13). That is why if Vth>2 V is satisfied, then the inequality on the left-hand side of Inequality (13) is satisfied. Also, if Vf0<1 V, it can be seen from Equation (7) that the denominator of the middle term of Inequality (13) becomes smaller than one and that term itself becomes greater than 2/1=2, thus satisfying the inequality on the right-hand side of Inequality (13).

In this case, if the performance of the diode is further enhanced to the point that Vf0<0.5 V is satisfied while Vth>2 V is also satisfied, then the following Inequality (14) is satisfied instead of Inequality (10). If Vf0<0.5 V is satisfied, then the voltage applied between the source and drain to make current flow from the source electrode 145 toward the drain electrode 170 when the transistor is in OFF state can be equal to or smaller than 0.5 V. Consequently, the diode current can be made to flow by applying a lower source-drain voltage than in a situation where a SiC Schottky barrier diode element (of which Vf0=about 0.8 V) is used.

$$3Ds < \frac{\varepsilon s}{\varepsilon i} \cdot Di \quad (14)$$

If Di is set to be 70 nm, then the following Inequality (15) is obtained with respect to Ds:

$$Ds < 50 \text{ nm} \quad (15)$$

If Equation (9) is generalized on the condition that Vth>2 V and Vf0<0.5 V are satisfied, the following Inequality (19) is obtained:

$$1 + \frac{\varepsilon s}{\varepsilon i} \cdot \frac{Di}{Ds} > \frac{2}{Pbi - \frac{q}{2\varepsilon s}(Nb \cdot Db(Db + 2Dc) - Nc \cdot Dc^2)} > 4 \quad (16)$$

As can be seen easily from Equation (9), the leftmost term of Inequality (16) is equal to Vth/Vf0 and Vf0 is equal to the denominator of the middle term of Inequality (16). That is why if Vth>2 V is satisfied, then the inequality on the left-hand side of Inequality (16) is satisfied. Also, if Vf0<0.5 V, it can be seen from Equation (7) that the denominator of the middle term of Inequality (16) becomes smaller than 0.5 and that term itself becomes greater than 2/0.5=4, thus satisfying the inequality on the right-hand side of Inequality (16).

Figure 3:
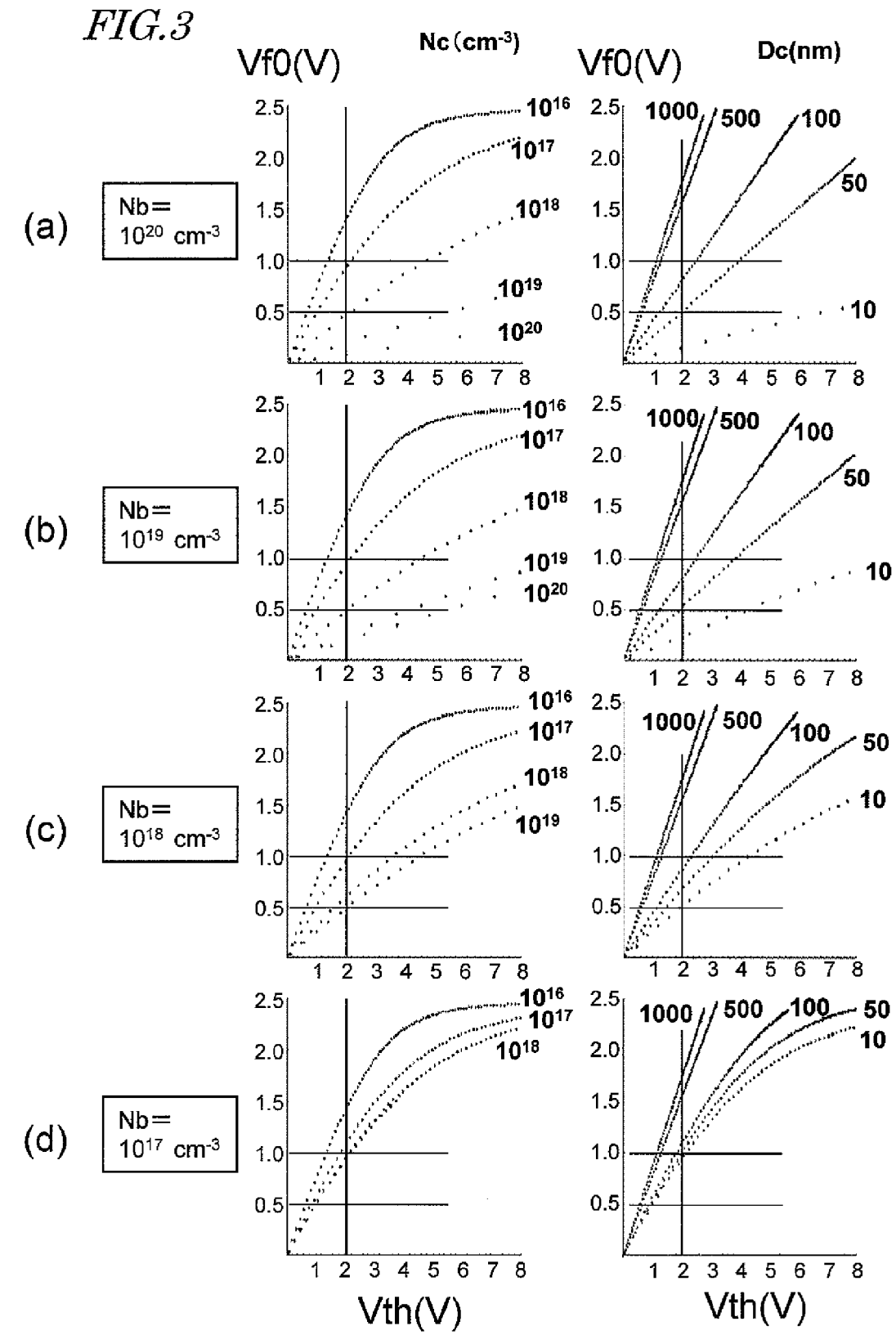
FIGS. 3 (a), (b), (c) and (d) are graphs showing how Vf0 (ordinate) changes with the threshold value (abscissa) when the p-body concentration (Nb) and the concentration (Nc) and thickness (Dc) of the channel layer are varied in an embodiment of the present invention.

Next, it will be described with reference to FIGS. 3(*a*) through 3(*d*) how Vth and Vf0 change with the dopant concentration Nc and thickness Dc of the channel layer.

The graph shown on the left-hand side of FIG. 3(a) shows relations between Nc, Vth and Vf0 in a situation where Nb=$10^{20}$ cm$^{-3}$. In this case, the digit of Nc is changed in five stages from $10^{16}$ cm$^{-3}$ through $10^{20}$ cm$^{-3}$. In this graph, the ordinate represents Vf0 and the abscissa represents Vth. Also shown in this graph are a line indicating that Vf0=0.5 V, a line indicating that Vf0=1 V and a line indicating that Vth=2V. On the other hand, the graph shown on the right-hand side of FIG. 3(a) shows relations between Dc, Vth and Vf0 in a situation where Nb=$10^{20}$ cm$^{-3}$. In this case, Dc is 10 nm, 50 nm, 100 nm, 500 nm or 1000 nm. In this graph, the ordinate represents Vf0 and the abscissa represents Vth, too. Also shown in this graph are a line indicating that Vf0=0.5 V, a line indicating that Vf0=1 V and a line indicating that Vth 2V.

Each pair of graphs shown in FIGS. 3(b), 3(c) and 3(d) corresponds to its counterpart shown in FIG. 3(a). Nevertheless, in the graphs shown in FIGS. 3(b), 3(c) and 3(d), Nb is $10^{19}$ cm$^{-3}$, $10^{18}$ cm$^{-3}$ and $10^{17}$ cm$^{-3}$, respectively.

Vth and Vf0 were calculated by the newly derived Equations (7) and (8), respectively.

As can be seen from FIG. 3(d), if Nb=$10^{17}$ cm$^{-3}$, there are no conditions that satisfy Vth>2 V and Vf0<1 V at the same time, irrespective of the dopant concentration Nc and thickness Dc of the channel layer.

It can be seen from FIG. 3(c) that if Nb=$10^{18}$ cm$^{-3}$, some channel concentration and thickness combinations do satisfy Vth>2 V and Vf0<1 V at the same time, but no channel concentration and thickness combinations satisfy Vth>2 V and Vf0<0.5 V at the same time.

And it can be seen from FIG. 3(b) that if Nb=$10^{19}$ cm$^{-3}$ some channel concentration and thickness combinations do satisfy Vth>2 V and Vf0<0.5 V at the same time.

To satisfy Vth>2 V and Vf0<1 V at the same time, all of the Inequalities (10), (11) and (12), Nb>$10^{17}$ cm$^{-3}$, and Nc>$10^{17}$ cm$^{-3}$ should be satisfied.

On the other hand, to satisfy Vth>2 V and Vf0<0.5 V at the same time, all of the Inequalities (14) and (15), Nb>$10^{18}$ cm$^{-3}$, and Nc>$10^{18}$ cm$^{-3}$ should be satisfied.

Next, it will be described with reference to FIGS. 4(a) through 4(b) how Dc and Vth depend on Nc when Vf0=1 V.

Figure 4:
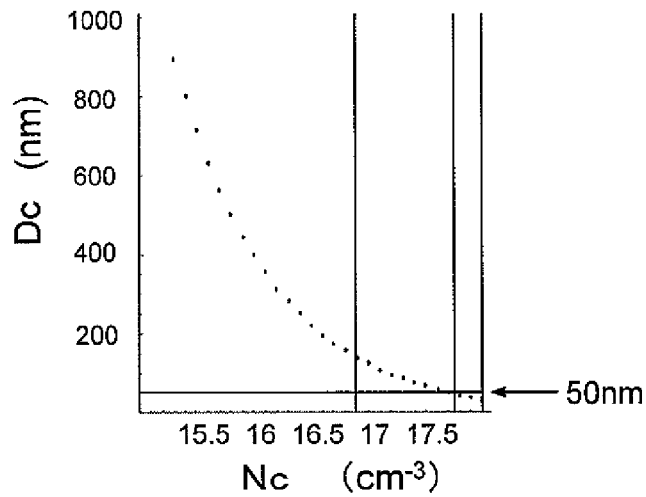
FIGS. 4 (a), (b) and (c) are graphs indicating the ranges to achieve Vf0=1 V in an embodiment of the present invention and showing the relation between the concentration (Nc) and thickness (Dc) of the channel layer, the concentration (Nc) of the channel layer and threshold value (Vth), and an effective region of the channel layer's concentration (Nc) where the threshold value (Vth) becomes greater than 2 V, respectively.
Figure 4:
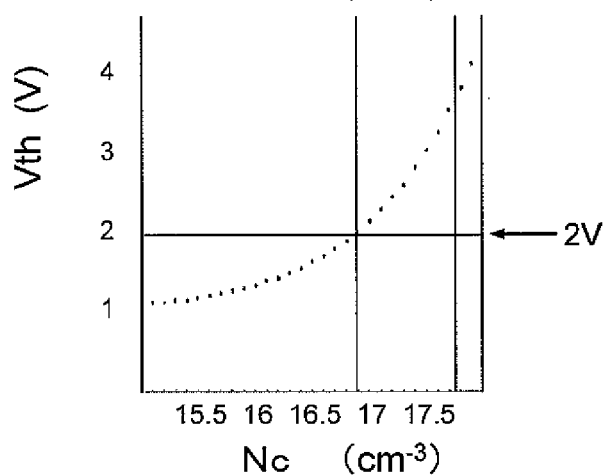
Figure 4:
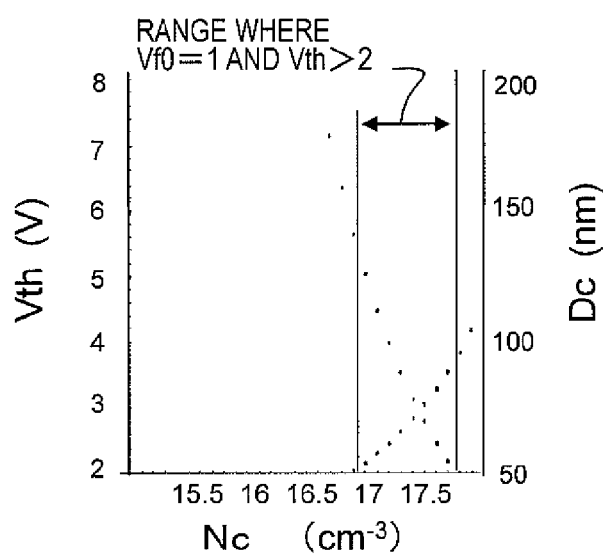

FIG. 4(a) is a graph showing the Nc dependence of Dc that makes Vf0=1 V in a situation where Di=70 nm and Nb=1×$10^{19}$ cm$^{-3}$. The range is shown in FIG. 4(a) up to the point where Nb=1×$10^{18}$ cm$^{-3}$, which is a little higher than the maximum concentration in the prior art, is satisfied. In the graph shown in FIG. 4(a), the ordinate represents Dc and the abscissa represents Nc. It should be noted that each of the numerical values on the axis of abscissas indicates the exponent of 10. Specifically, "16" means 1×$10^{16}$ (cm$^{-3}$) and "16.5" means 1×$10^{16.5}$ (cm$^{-3}$). The same can be said about the numerical value on the axis of abscissas shown in FIGS. 4(b) and 4(c) to be described below.

Also drawn in the graph shown in FIG. 4(a) is a horizontal line indicating that the thickness is 50 nm. In the prior art, the thickness Dc of the channel layer is normally set to be 50 nm or more. The smaller Nc, the greater Dc should be. It means that at or over that Dc value (i.e., in the range over the plots shown in FIG. 4(a)), Vf0<1 V is satisfied and the object of the present invention is achieved as far as the diode operation is concerned.

FIG. 4(b) is a graph showing the Nc dependence of Vth if Dc makes Vf0=1 V in a situation where Di=70 nm and Nb=1×$10^{19}$ cm$^{-3}$. In the graph shown in FIG. 4(b), the ordinate represents Vth and the abscissa represents Nc. Also drawn in the graph shown in FIG. 4(b) is a horizontal line indicating that Vth=2 V. It can be seen that to satisfy Vf0=1 V and Vth>2 V, Nc should be set to be higher than about 1×$10^{17}$ cm$^{-3}$.

FIG. 4(c) is a graph showing respective portions of FIGS. 4(a) and 4(b) in combination. In this graph, the ordinate on the left-hand side represents Dc, the ordinate on the right-hand side represents Vth, and the abscissa represents Nc. As can be seen from FIG. 4(c), there are several plots inside a range where Dc that makes Vf0=1 V is thicker than 50 nm and where Vth is greater than 2 V. This means that both of these two requirements are satisfied inside of that range. That is to say, in a situation where Vf0=1 V, even if the thickness Dc of the channel layer is set to be equal to or greater than 50 nm, Vth>2 V can still be achieved.

Next, it will be described with reference to FIG. 5 how Dc and Vth depend on Nc when Vf0 is set to be 0.5 V. FIGS. 5(a), 5(b) and 5(c) are graphs corresponding to FIGS. 4(a), 4(b) and 4(c), respectively.

Figure 5:
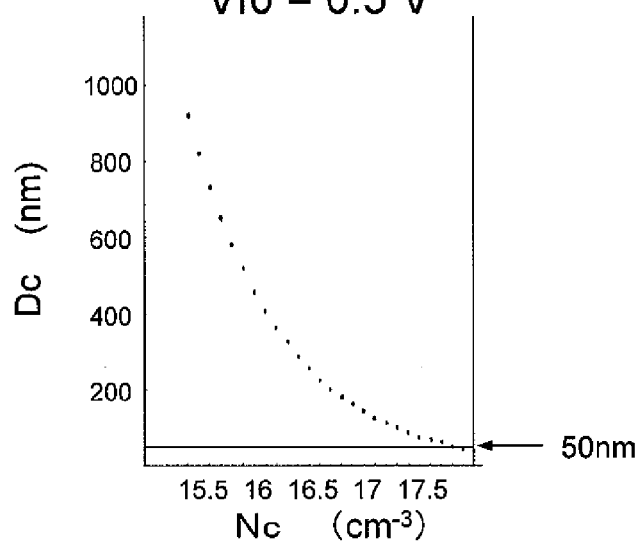
FIGS. 5 (a), (b) and (c) are graphs indicating the ranges to achieve Vf0=0.5 V in an embodiment of the present invention and showing the relation between the concentration (Nc) and thickness (Dc) of the channel layer, the concentration (Nc) of the channel layer and the threshold value (Vth), and an effective region of the channel layer's concentration (Nc) where the threshold value (Vth) becomes greater than 2 V, respectively.
Figure 5:
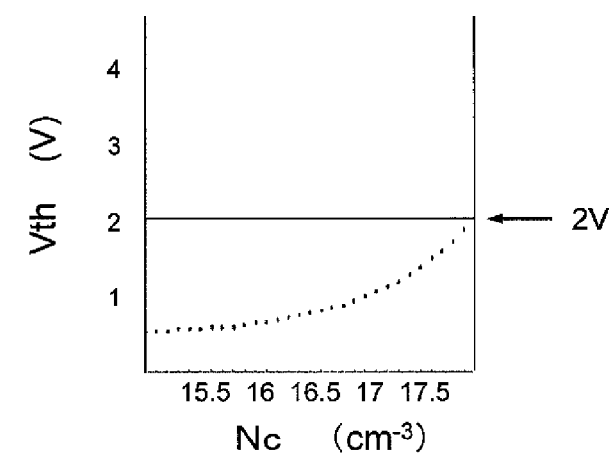
Figure 5:
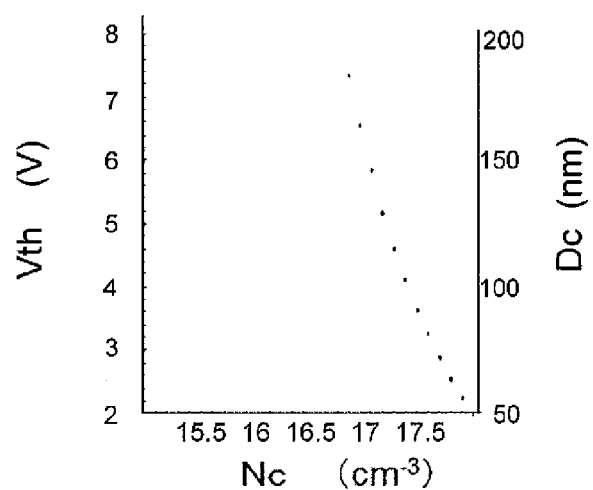

As can be seen from FIG. 5(a), in a range where the thickness Dc of the channel layer is increased to more than 50 nm, Vf0=0.5 V can be satisfied. However, as can be seen from FIG. 5(b), when the thickness Dc of the channel layer satisfies Vf0=0.5 V, there are no plots at which the Vth>2 V is satisfied in the Nc concentration range shown in FIG. 5. Consequently, in the range where the thickness Dc of the channel layer is greater than 50 nm and where Nc is smaller than 1×$10^{18}$ cm$^{-3}$, not both of Vf0=0.5 V and Vth>2 V can be achieved.

Figure 6:
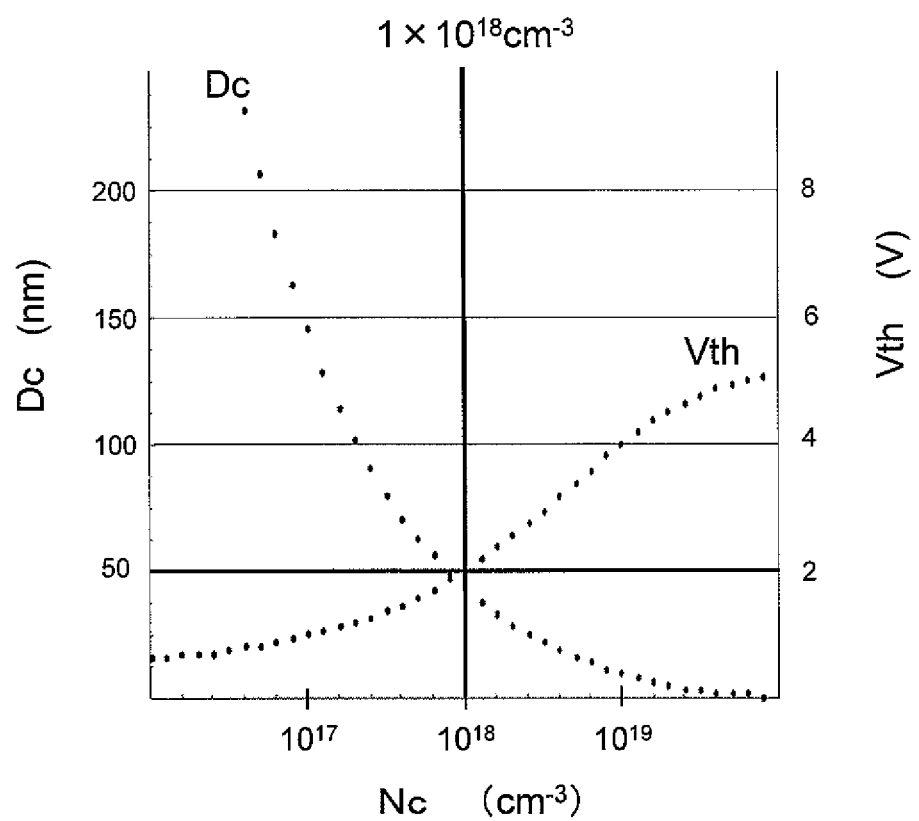
FIG. 6 A graph showing a relation between the concentration (Nc) and thickness (Dc) of the channel layer and the threshold value (Vth) in an embodiment of the present invention.

FIG. 6 shows what relation Nc and Dc should have to get Vf0=0.5 V satisfied by the newly derived Equations (9) and (13) and also shows Vth values associated with such Nc and Dc combinations. In the graph shown in FIG. 6, the ordinate represents the thickness Dc of the channel layer and the abscissa represents the dopant concentration Nc of the channel layer. It should be noted that each of the numerical values on the axis of abscissas indicates the exponent of 10. For example, "18" means 1×$10^{18}$ (cm$^{-3}$). The results shown in FIG. 6 revealed that if Dc<50 nm and Nc>1×$10^{18}$ cm$^{-3}$ were satisfied, a range where Vth>2 V could be created.

As can be seen from the foregoing description, in order to lower the turn-on voltage Vf0 of the diode to 0.5 V or less while satisfying Vth>2 V, the thickness and the dopant concentration of the channel layer should be set to fall within appropriate ranges. The thickness Dc of the channel layer is preferably smaller than 50 nm, and more preferably equal to or smaller than 40 nm.

The condition for lowering Vf0 to 0.5 V or less while satisfying Vth>2 V has been described in detail. However, the present invention is also applicable to a situation where Vf0 is set to fall within the range of 0.5 V to 1.0 V with Vth>2 V satisfied. The following Table 1 shows examples of conditions for setting Vf within the range of 0.6 V to 0.9 V:

TABLE 1

| Vf0 (volts) | Lower limit of Vth/Vfo | Lower limit of Nb, Nc (cm$^{-3}$) |
| --- | --- | --- |
| 0.9 | 2.2 | 1 × $10^{17}$ |
| 0.8 | 2.5 | 2 × $10^{17}$ |
| 0.7 | 2.9 | 3 × $10^{17}$ |
| 0.6 | 3.3 | Nb > 1 × $10^{18}$ |
|  |  | Nc > 5 × $10^{17}$ |

The lower limit of Vth/Vfo in Table 1 corresponds to the rightmost numerical value in Inequalities (13) and (16).

The embodiment of the present invention described above is a semiconductor element including a MISFET with a planar structure. However, the semiconductor element of the present invention may also be a semiconductor element including a MISFET with a trench structure.

Also, although an embodiment of the present invention that uses silicon carbide (SiC) has been described in detail in the foregoing description, the present invention can also be carried out in the same way using GaN or any other wide bandgap semiconductor as when silicon carbide is used.

INDUSTRIAL APPLICABILITY

According to the present invention, the MISFET can have its threshold value Vth increased sufficiently when operated as such (i.e., as a MISFET) and can also have the absolute value of its turn-on voltage decreased sufficiently when operated as a diode. The present invention provides a semiconductor element that can drive a power electronic circuit such as an inverter with good stability without increasing the number of components.

REFERENCE SIGNS LIST 110 substrate
120 drift layer
121 JFET region
130 p-body region
132 p$^+$-contact region
140 source region
145 source electrode
150 channel layer
160 gate insulating film
165 gate electrode
170 drain electrode

The invention claimed is:

1. A semiconductor element including a metal-insulator-semiconductor field effect transistor, the metal-insulator-semiconductor field effect transistor comprising:
   a wide-bandgap semiconductor including:
      a body region of a first conductivity type;
      a source region of a second conductivity type, the source region contacting with at least a portion of the body region;
      a drift region of the second conductivity type, the drift region being isolated from the source region via that portion of the body region; and
      a channel layer of the second conductivity type, the channel layer contacting with the surface of that portion of the body region that is located between the source region and the drift region;
   an insulating film that contacts with the surface of the channel layer;
   a gate electrode that faces the channel layer with the insulating film interposed between them;
   a source electrode that contacts with the source region; and
   a drain electrode that is electrically connected to the drift region,
   wherein supposing the potential of the drain electrode with respect to the potential of the source electrode is identified by Vds,
   the potential of the gate electrode with respect to the potential of the source electrode is identified by Vgs,
   the gate threshold voltage of the metal-insulator-semiconductor field effect transistor is identified by Vth,
   the direction of current flowing from the drain electrode toward the source electrode is defined to be a forward direction, and
   the direction of current flowing from the source electrode toward the drain electrode is defined to be a reverse direction,
   if Vgs≥Vth,
   then the metal-insulator-semiconductor field effect transistor makes the drain electrode and the source electrode electrically conductive with each other via the channel layer, and
   if 0 volts≤Vgs<Vth,
   then the metal-insulator-semiconductor field effect transistor functions as a diode that makes no current flow in the forward direction but makes current flow in the reverse direction from the source electrode toward the drain electrode via the channel layer when Vds<0 volts, and
   if the potential Vgs of the gate electrode with respect to the potential of the source electrode is 0 volts,
   then a depletion layer with a thickness Dc, which has been depleted entirely in the thickness direction, is formed in at least a part of the channel layer due to the presence of a pn junction between that portion of the body region and the channel layer, and another depletion layer that has a thickness Db as measured from the junction surface of the pn junction is formed in that portion of the body region, and
   wherein supposing the dielectric constant of the wide bandgap semiconductor is identified by ∈S,
   the dielectric constant and the thickness of the insulating film are identified by ∈i and Di, respectively,
   the sum of Dc and Db is identified by Ds, and
   the absolute value of a turn-on voltage of the diode is identified by Vf0,
   then Ds<Di·∈s/(∈i (2/Vf0−1)) is satisfied,
   wherein the wide bandgap semiconductor is made of silicon carbide, and
   wherein supposing the dopant concentrations of the body region and the channel layer are identified by Nb and Nc, respectively,
   Vf0<0.5 volts,
   Ds<(⅔)·Di,
   Nb>1×10$^{18}$ cm$^{-3}$, and
   Nc>1×10$^{18}$ cm$^{-3}$ are satisfied.

2. The semiconductor element of claim 1, wherein supposing the dopant concentration of the body region is identified by Nb,
   the dopant concentration of the channel layer is identified by Nc,
   the built-in potential of the PN junction is identified by Pbi, and
   elementary charge is q,
   (1+(∈s/∈i)·(Di/Ds))>2/(Pbi−(0.5q/∈s)·(Nb·Db (Db+2Dc)−Nc·Dc$^2$))>4 is satisfied.

3. The semiconductor element of claim 1, wherein Ds is greater than 14 nm.

4. The semiconductor element of claim 1, wherein at least one of Nb and Nc is equal to or smaller than 1.4×10$^{19}$ cm$^{-3}$.

5. The semiconductor element of claim 1, wherein the wide bandgap semiconductor is made of silicon carbide, and wherein Ds is smaller than 50 nm.

* * * * *